(12) United States Patent
Kobayashi

(10) Patent No.: US 11,631,649 B2
(45) Date of Patent: Apr. 18, 2023

(54) BONDED BODY AND MANUFACTURING METHOD OF BONDED BODY

(71) Applicant: OLYMPUS CORPORATION, Tokyo (JP)

(72) Inventor: Hiroshi Kobayashi, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 195 days.

(21) Appl. No.: 17/345,532

(22) Filed: Jun. 11, 2021

(65) Prior Publication Data

US 2021/0351148 A1 Nov. 11, 2021

Related U.S. Application Data

(63) Continuation of application No. PCT/JP2018/046070, filed on Dec. 14, 2018.

(51) Int. Cl.
H01L 23/00 (2006.01)

(52) U.S. Cl.
CPC ............. *H01L 24/13* (2013.01); *H01L 24/11* (2013.01); *H01L 24/16* (2013.01); *H01L 24/81* (2013.01); *H01L 2224/11462* (2013.01); *H01L 2224/1308* (2013.01); *H01L 2224/13019* (2013.01);
(Continued)

(58) Field of Classification Search
CPC ......... H01L 24/13; H01L 24/11; H01L 24/16; H01L 24/81; H01L 2224/11462; H01L 2224/13019; H01L 2224/1308; H01L 2224/13647; H01L 2224/16145; H01L 2224/81801; H01L 24/03; H01L 24/29; H01L 24/32; H01L 2224/0345; H01L 2224/0401; H01L 2224/05008; H01L 2224/05013; H01L 2224/05027; H01L 2224/05553; H01L 2224/05647; H01L 2224/1147; H01L 2224/13012; H01L 2224/13144; H01L 2224/1601; H01L 2224/2919; H01L 2224/73204; H01L 2224/81815; H01L 24/05; H01L 2224/13006; H01L 2224/13014; H01L 2224/13021; H01L 2224/13022; H01L 2224/13082; H01L 2224/131;
(Continued)

(56) References Cited

FOREIGN PATENT DOCUMENTS

| JP | 2000286297 A | * 10/2000 | ........... H01L 21/563 |
| JP | 2003-243438 A | 8/2003 | |
| JP | 2005-150299 A | 6/2005 | |

(Continued)

OTHER PUBLICATIONS

International Search Report dated Feb. 19, 2019 received in PCT/JP2018/046070.

*Primary Examiner* — Douglas W Owens
(74) *Attorney, Agent, or Firm* — Scully, Scott, Murphy & Presser, P.C.

(57) ABSTRACT

A bonded body includes: a first base body including a first wiring, a first electrode made of an electroplating film and including a first surface having a first region covering a periphery of an end portion of the first wiring and a second region covering the end portion of the first wiring, and a first passivation layer made of an insulating material and covering a periphery of the first electrode; a second base body including a second electrode; and solder disposed between the first region of the first electrode and the second electrode.

7 Claims, 7 Drawing Sheets

(52) U.S. Cl.
CPC .............. *H01L 2224/13647* (2013.01); *H01L 2224/16145* (2013.01); *H01L 2224/81801* (2013.01)

(58) Field of Classification Search
CPC . H01L 2224/13147; H01L 2224/13155; H01L 2224/32225; H01L 2224/81193
See application file for complete search history.

(56) References Cited

FOREIGN PATENT DOCUMENTS

| | | |
|---|---|---|
| JP | 2005-294482 A | 10/2005 |
| JP | 2005-347513 A | 12/2005 |
| JP | 2010-092974 A | 4/2010 |
| JP | 2010-267741 A | 11/2010 |
| JP | 2011-034988 A | 2/2011 |
| JP | 2014-017454 A | 1/2014 |
| WO | 2018/092242 A1 | 5/2018 |

* cited by examiner

BONDED BODY AND MANUFACTURING METHOD OF BONDED BODY

CROSS REFERENCE TO RELATED APPLICATION

This application is a continuation application of PCT/JP2018/046070 filed on Dec. 14, 2018, the entire contents of which are incorporated herein by this reference.

BACKGROUND OF THE INVENTION

1. Field of the Invention

An embodiment of the present invention relates to a bonded body in which a first electrode of a first base body and a second electrode of a second base body are bonded to each other by solder, and a manufacturing method of the bonded body in which the first electrode of the first base body and the second electrode of the second base body are bonded to each other by the solder.

2. Description of the Related Art

WO 2018/092242 discloses a bonded body in which a first electrode and a second electrode are thermally press-bonded to each other, with a sealing layer disposed between the first electrode and the second electrode. The sealing layer includes a filler made of an inorganic material and made of an NCF (Non Conductive Film) or NCP (Non Conductive Paste).

A filler remained on a bonding interface might cause a degradation in reliability of the bonded body. Therefore, in the above-described bonded body, an electrode made of a conductive body is disposed on a passivation layer made of an insulating material, to thereby form a bonding surface of the electrodes in a convex shape in which a filler hardly remains.

In order to further improve the reliability of the bonded body, the solder bonding method is preferable to the compression bonding method.

SUMMARY OF THE INVENTION

A bonded body according to an embodiment includes: a first base body including a first principal surface on which a first wiring, a first electrode made of an electroplating film, and a first passivation layer made of an insulating material are disposed, the first electrode including a first surface having a first region covering a periphery of an end portion of the first wiring and a second region covering the end portion of the first wiring, the first passivation layer covering a periphery of the first electrode; a second base body including a second principal surface on which a second electrode is disposed; and solder disposed between the first region of the first electrode and the second electrode.

A manufacturing method of a bonded body according to an embodiment is a manufacturing method of a bonded body in which a first base body including a first principal surface and a second base body including a second principal surface are bonded to each other. The first base body includes a first wiring and a first electrode that are disposed on the first principal surface, the first electrode including a first surface having a first region covering a periphery of an end portion of the first wiring and a second region covering the end portion of the first wiring, the second region having a height higher than a height of the first region due to a thickness of the first wiring. The second base body includes a second electrode disposed on the second principal surface. The method includes: bringing the first electrode and the second electrode into contact with each other, with solder disposed on the second electrode being melted; and causing the solder to flow in between the first region of the first electrode and a second surface of the second electrode.

DETAILED DESCRIPTION OF THE PREFERRED EMBODIMENT(S)

Figure 1:
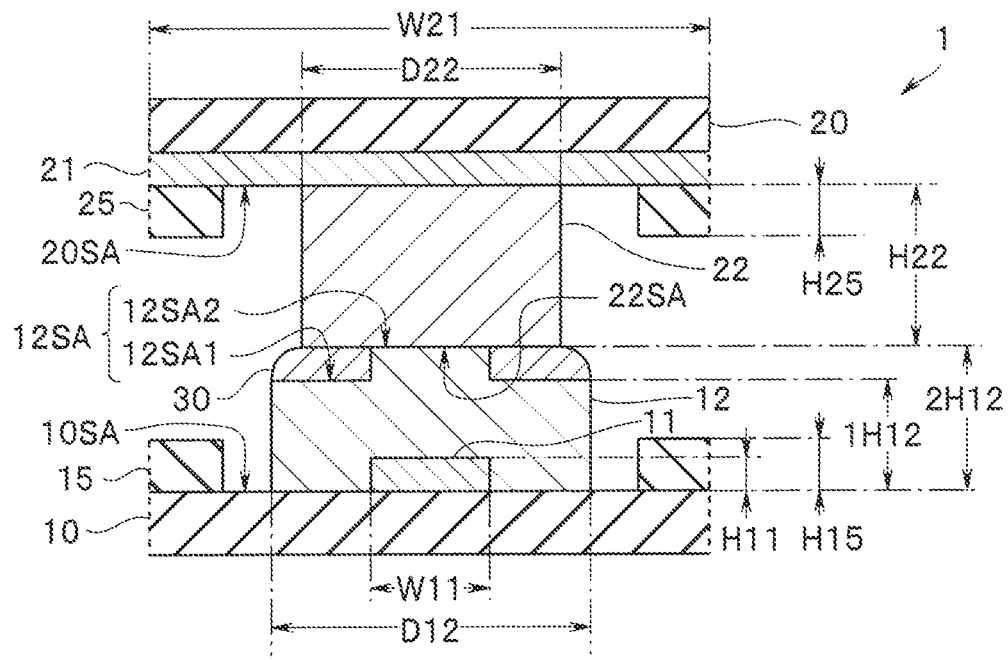
FIG. 1 is a sectional view of a bonded body according to an embodiment.

As illustrated in FIG. 1, a bonded body 1 according to an embodiment includes a first base body 10 having a first principal surface 10SA, a second base body 20 having a second principal surface 20SA, and a solder 30.

Note that, in the description below, the drawings based on each embodiment are schematic. The relationship between thicknesses and widths of respective parts, a ratio of a thickness of a certain part to that of another part, a relative angle and the like of the respective parts are different from the actual ones. The respective drawings include parts in which the relationships and ratios among the dimensions are different.

For example, the first base body 10 is an image pickup device, and the second base body 20 is a semiconductor device in which a semiconductor circuit is formed. The semiconductor circuit is configured to process an image pickup signal outputted from the image pickup device. The bonded body 1 may be a stacked semiconductor including the first base body 10 and the second base body 20 that are semiconductor devices.

The first base body 10 and the second base body 20 may be bonded to each other with a plurality of bonding portions. In other words, the bonded body 1 may include a plurality of bonding portions (a plurality of first electrodes 12, a plurality of second electrodes 22, a plurality of soldered parts 30, etc.). Description will be made below on one bonding portion.

Figure 2:
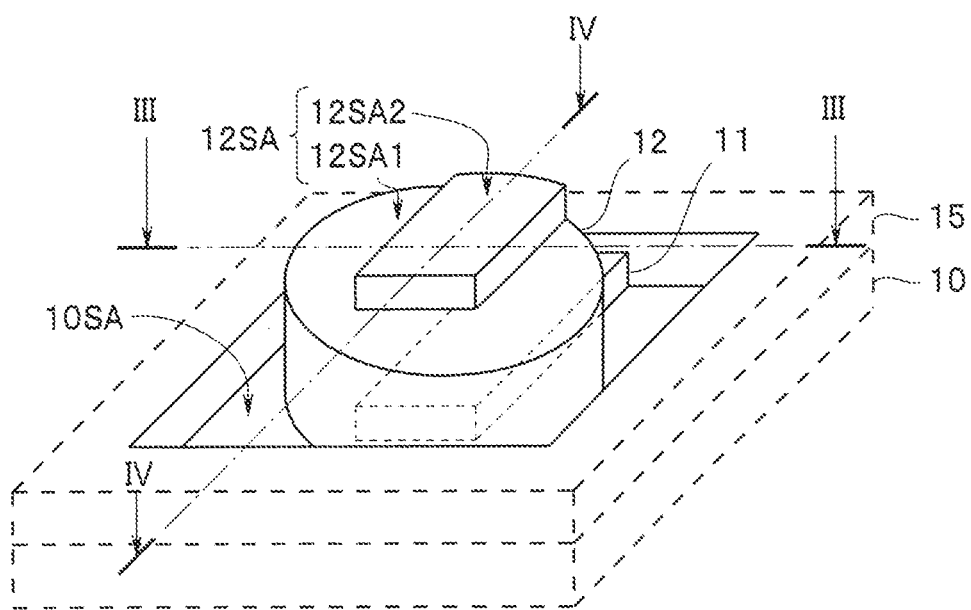
FIG. 2 is a perspective view of a first base body of the bonded body according to the embodiment.
Figure 3:
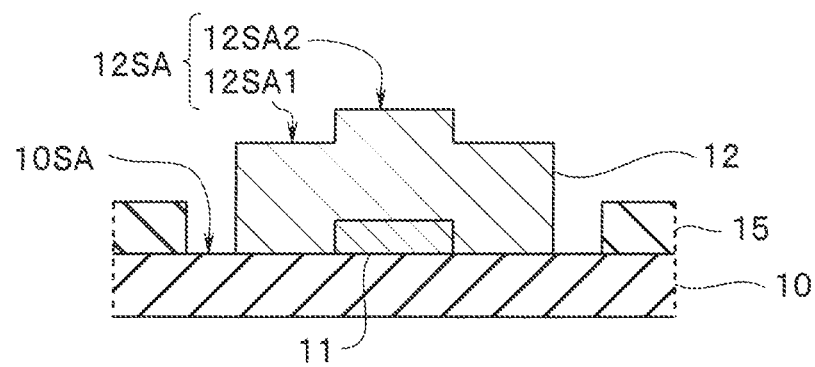
FIG. 3 is a sectional view of the first base body of the bonded body according to the embodiment, which is taken along the line III-III in FIG. 2.
Figure 4:
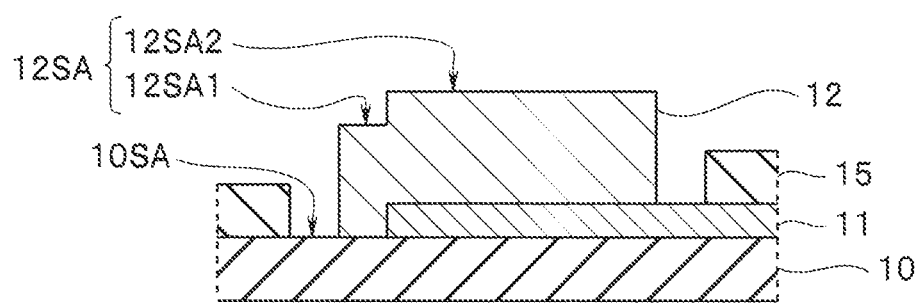
FIG. 4 is a sectional view of the first base body of the bonded body according to the embodiment, which is taken along the line IV-IV in FIG. 2.

As illustrated in FIGS. 2, 3, and 4, the first base body 10 includes a first wiring 11 and a first electrode 12 on the first principal surface 10SA.

The first electrode 12 covers an end portion of the first wiring 11 and a part of the first principal surface 10SA, the part being the periphery of the end portion of the first wiring 11. A first surface 12SA of the first electrode 12 includes a first region 12SA1 and a second region 12SA2. The first region 12SA1 covers the part of the first principal surface 10SA, the part being the periphery of the end portion of the first wiring 11. The second region 12SA2 covers the end portion of the first wiring 11. A top surface of the first wiring 11 is a flat surface. Therefore, the second region 12SA2 is a flat surface, the height of which from the first principal surface 10SA is higher than the height of the first region 12SA1 from the first principal surface 10SA, due to the thickness of the first wiring 11. A height 2H12 of the second region 12SA2 from the first principal surface 10SA is a sum of the thickness H11 of the first wiring 11 and the thickness of the first electrode 12.

The height 1H12 of the first region 12SA1 from the first principal surface 10SA is 1 µm to 20 µm, for example. The first wiring 11 has the thickness H11 of 1 µm to 4 µm. The height 2H12 of the second region 12SA2 from the first principal surface 10SA is 1 µm to 4 µm higher than the height 1H12 of the first region 12SA1.

Furthermore, a diameter D12 of the first electrode 12 is 10 µm to 100 µm, and a width W11 of the first wiring 11 is 5 µm to 50 µm, for example. The diameter D12 of the first electrode 12 is larger than the width W11 of the first wiring 11 and the top surface of the first wiring 11 is a flat surface. Therefore, the first electrode 12 covering the first wiring 11 has a convex shape and the first region 12SA1 and the second region 12SA2 are flat surfaces.

The second base body 20 includes, on the second principal surface 20SA, a second wiring 21 and a second electrode 22 covering an end portion of the second wiring 21. Since a width of the second wiring 21 is larger than a diameter D22 of the second electrode 22, a second surface 22SA, which is the top surface of the second electrode 22, is a flat surface. A height H22 of the second surface 22SA is 1 µm to 20 µm, for example. The diameter D22 of the second electrode 22 is substantially equal to the diameter D12 of the first electrode 12, and is larger than the width W11 of the first wiring 11. A width W21 of the second wiring 21 is larger than the diameter D22 of the second electrode 22.

Note that the end portion of the first wiring 11 may be a circular electrode pad which is connected to a through-wiring, not illustrated, and which has a diameter smaller than the diameter D12 of the first electrode 12. In this case, the second region 12SA2 has a circular shape, and the first region 12SA1 has a ring shape surrounding the second region 12SA2. Furthermore, the end portion of the second wiring 21 may be a circular electrode pad which is connected to the through-wiring, not illustrated, and which has a diameter larger than the diameter D22 of the second electrode 22.

Note that a first passivation layer 15 is disposed on the periphery of the first electrode 12. A second passivation layer 25 is disposed on the periphery of the second electrode 22. The first passivation layer 15 and the second passivation layer 25 are made of an insulating material. The thicknesses H15, H25 of the first and second passivation layers 15, 25 are smaller than the heights 2H12, H22 of the first and second electrodes 12, 22.

The solder 30 bonds the first electrode 12 and the second electrode 22, and is disposed between the first region 12SA1 of the first electrode 12 and the second electrode 22. In other words, the solder 30 is accommodated in a gap of 1 µm to 10 µm. The gap is created by a difference between the height of the first region 12SA1 and the height of the second region 12SA2.

The first and second electrodes are bonded to each other by the solder 30, and the solder 30 is accommodated in the gap between the first region 12SA1 of the first electrode 12 and the second electrode 22, to be prevented from spreading around the electrodes, which provides a high reliability of the bonded body.

It is preferable that the second region 12SA2 of the first electrode 12 and the second electrode 22 are in contact with each other, although they do not have to. If the second region 12SA2 of the first electrode 12 and the second electrode 22 are in contact with each other, the distance between the first region 12SA1 and the second electrode 22 is equal to the thickness H11 of the first wiring 11, to thereby prevent the solder 30 from spreading around the electrodes. As a result, a high reliability of the bonded body 1 is achieved.

Even if the second region 12SA2 and the second electrode 22 are in contact with each other, since the surface of the second region 12SA2 and the surface of the second electrode 22 are not complete flat surfaces without surface roughness, a small amount of solder remains on the bonding surface. In other words, if the distance between the first principal surface 10SA and the second principal surface 20SA are substantially specified by the surface of the second region 12SA2 and the surface of the second electrode 22 being in contact with each other, the solder may exist on the bonding surface.

If the bonded body 1 has a plurality of bonding portions, it is preferable, in particular, that the second region 12SA2 and the second electrode 22 are in contact with each other at the plurality of bonding portions, in order to dispose the first principal surface 10SA and the second principal surface 20SA in parallel with each other.

In addition, although not illustrated, it is preferable that the space between the first principal surface 10SA and the second principal surface 20SA are sealed with a sealing resin.

Manufacturing Method of Bonded Body

Figure 5:
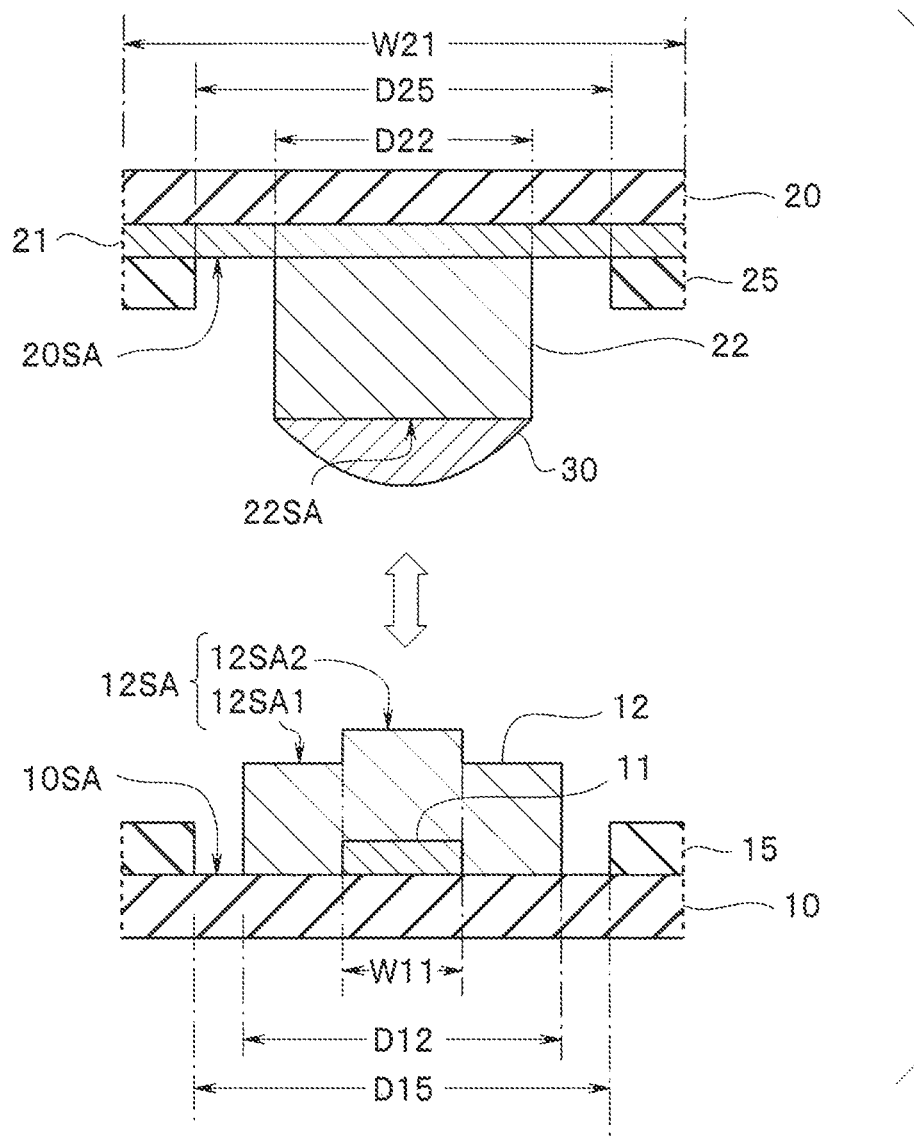
FIG. 5 is a sectional view for describing a manufacturing method of the bonded body according to the embodiment.

As illustrated in FIG. 5, the first wiring 11 is disposed on the first principal surface 10SA of the first base body 10. The first wiring 11, which is made of a conductive body such as aluminum, copper, or the like, is electrically connected to the light-receiving portion of the image pickup device via a through-wiring, not illustrated, for example.

The first passivation layer 15 is then disposed. The first passivation layer 15, which is made of an insulating material such as resin, silicon oxide, or the like, is formed by photoresist or using the CVD method, for example, and the opening of the first passivation layer is patterned.

A diameter D15 of the opening, which has a circular shape, of the first passivation layer 15 is larger than the diameter D12 (40 µm, for example) of the first electrode 12. The diameter D15 is 60 µm, for example.

A seed layer (not illustrated) is disposed on the entire surface of the first principal surface 10SA. For example, a copper layer having a thickness of 0.1 µm is formed by the sputtering method. The seed layer is a conductive base layer for electroplating.

Then, a plating mask layer is disposed by using the photolithography method. The plating mask layer includes an opening having a diameter of 40 µm, for example, corresponding to the diameter D12 of the first electrode 12.

After the photoresist is applied or a film resist is laminated on the first principal surface 10SA as the plating mask layer (not illustrated), exposure processing and developing processing are performed, and then the opening is formed. The thickness of the plating mask layer is preferably equal to or larger than the height of the first electrode 12 in order to form the side surface of the first electrode 12 as a straight bump perpendicular to the first principal surface 10SA.

Next, the first electrode 12 is disposed by using the electroplating method, and then the plating mask layer and the seed layer are separated. The first electrode 12 is a substantially columnar-shaped bump having a predetermined thickness (height) and made of a copper plating film.

The first electrode 12 may be a multi-layer film made of copper, nickel, gold, or the like, for example.

The first surface 12SA of the first electrode 12 having the diameter D12 of 40 µm includes the first region 12SA1 and the second region 12SA2. The first region 12SA1 is formed on the first principal surface 10SA. The second region 12SA2 is formed on the first wiring 11 having the width W11 of 15 µm.

The first base body 10 satisfies the condition of (Expression 1) shown below. It means that the first surface 12SA includes the first region 12SA1 and the second region 12SA2, the height of which from the first principal surface 10SA is higher than the height of the first region 12SA1 from the first principal surface 10SA.

The diameter D15 of the opening of first passivation layer 15>the diameter D12 of the first electrode 12>the width W11 of the first wiring 11 (Expression 1)

The shape of the second region 12SA2 is substantially the same as the shape of the first wiring 11 disposed under the second region 12SA2, and the difference between the height of the first region 12SA1 and the height of the second region 12SA2 is substantially the same as the thickness of the first wiring 11. In addition, since the top surface of the first wiring 11 is a flat surface, the second region 12SA2 is a flat surface.

The second base body 20 is fabricated separately. In the second base body 20, the width W21 of the second wiring 21 is larger than the diameter D22 of the second electrode 22. The diameter D22 of the second electrode 22 is substantially the same as the diameter D12 of the first electrode 12 and is larger than the width W11 of the first wiring 11. The diameter D25 of the opening of the second passivation layer 25 is larger than the diameter D22 of the second electrode 22.

The second base body 20 satisfies the condition of (Expression 2) shown below. It means that the second surface 22SA is a flat surface.

The width W21 of the second wiring 21>the diameter D25 of the opening of the second passivation layer 25>the diameter D22 of the second electrode 22 (Expression 2)

Note that the solder 30 is disposed only on the second electrode 22, and is not disposed on the first electrode 12.

As illustrated in FIG. 5, in the bonding process, the first electrode 12 and the second electrode 22 are brought into contact with each other, with the solder 30 being melted. Therefore, the solder 30 flows in between the first region 12SA1 of the first electrode 12 and the second electrode 22.

According to the present manufacturing method, the distance between the first principal surface 10SA and the second principal surface 20SA does not vary depending on the bonding conditions, to thereby enable fabrication of the bonded body 1 having a high reliability. In addition, the solder 30 is accommodated between the first region 12SA1 and the second electrode 22, to thereby prevent the solder from spreading around the bonding portion.

MODIFICATIONS OF EMBODIMENT

Next, description will be made on the modifications of the embodiment. Bonded bodies 1A to 1D according to the respective modifications are similar to the bonded body 1 according to the embodiment. Therefore, the same constituent elements are added with the same reference numerals and descriptions thereof will be omitted.

First Modification of Embodiment

Figure 6:
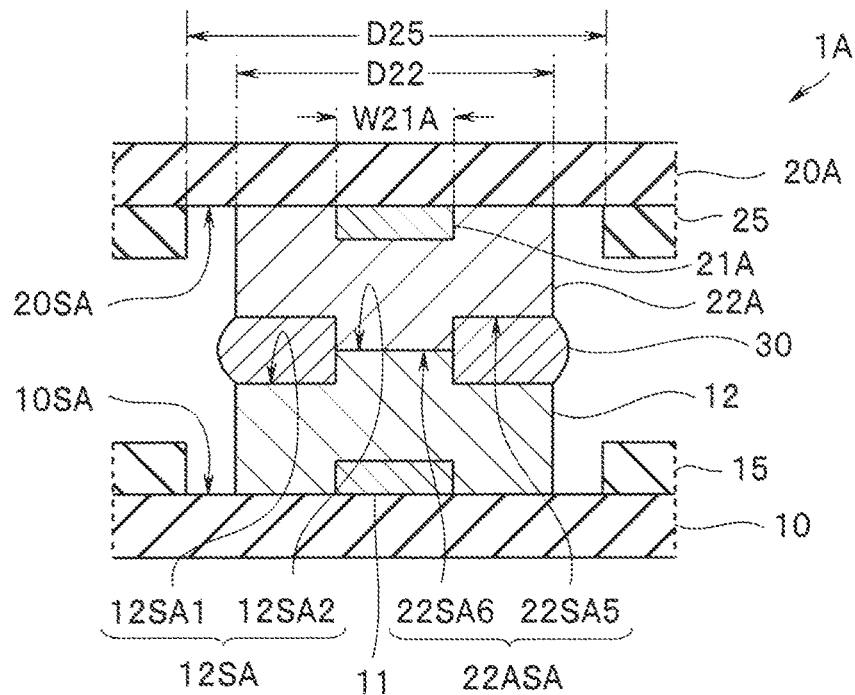
FIG. 6 is a sectional view of a bonded body according to a first modification of the embodiment.

As illustrated in FIG. 6, a second base body 20A of the bonded body 1A according to the first modification satisfies the condition of (Expression 3) shown below.

A diameter D25 of an opening of a second passivation layer 25>a diameter D22 of a second electrode 22A>a width W21A of a second wiring 21A (Expression 3)

The bonded body 1A includes the second electrode 22A having substantially the same configuration as that of a first electrode 12. In other words, a second surface 22ASA of the second electrode 22A includes a fifth region 22SA5 and a sixth region 22SA6. The second electrode 22A covers the second wiring 21A whose top surface is a flat surface. Therefore, the sixth region 22SA6 is a flat surface, the height of which from the second principal surface 20SA is higher than the height of the fifth region 22SA5 from the second principal surface 20SA. The height of the sixth region 22SA6 from the second principal surface 20SA is a sum of the thickness of the second wiring 21A and the thickness of the second electrode 22A.

The second region 12SA2 of the first electrode 12 and the sixth region 22SA6 of the second electrode 22A are in contact with each other, and the solder 30 is disposed between the first region 12SA1 of the first electrode 12 and the fifth region 22SA5 of the second electrode 22A.

The bonded body 1A has a larger space for accommodating the solder 30 than the bonded body 1. The solder 30 is not likely to spread around the space, in particular.

Second Modification of Embodiment

Figure 7:
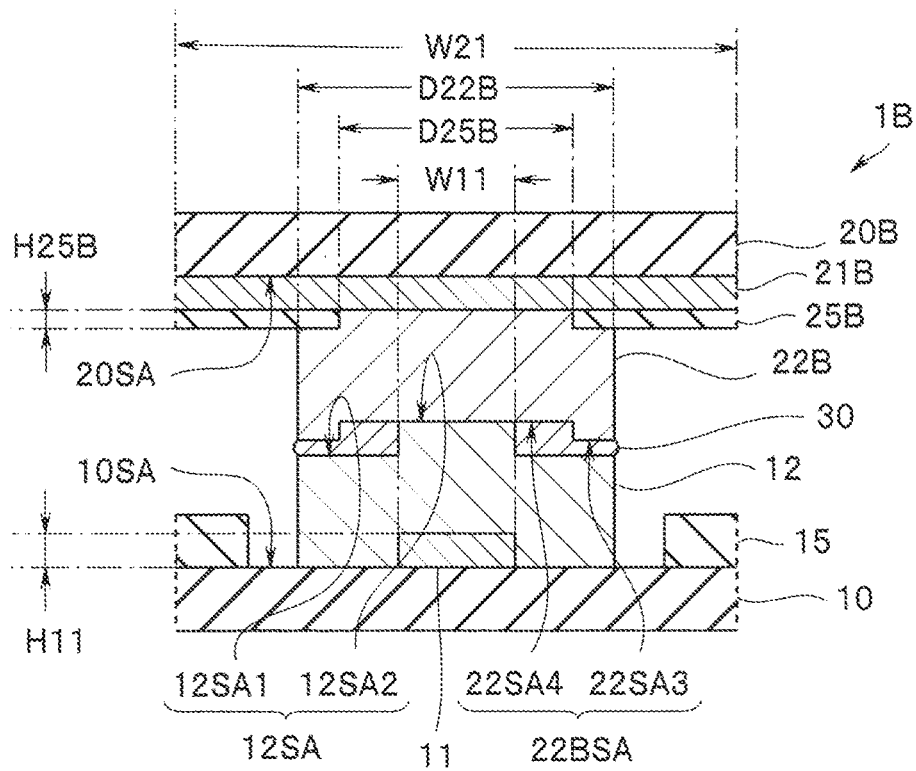
FIG. 7 is a sectional view of a bonded body according to a second modification of the embodiment.

As illustrated in FIG. 7, a second base body 20B of the bonded body 1B according to the second modification satisfies the condition of (Expression 4) shown below.

A width W21 of a second wiring 21>a diameter D22B of a second electrode 22B>a diameter D25B of an opening of a second passivation layer 25B>the width W11 of the first wiring 11 (Expression 4)

The height H11 of the first wiring 11 is higher than a thickness H25B of the second passivation layer 25B.

Figure 8:
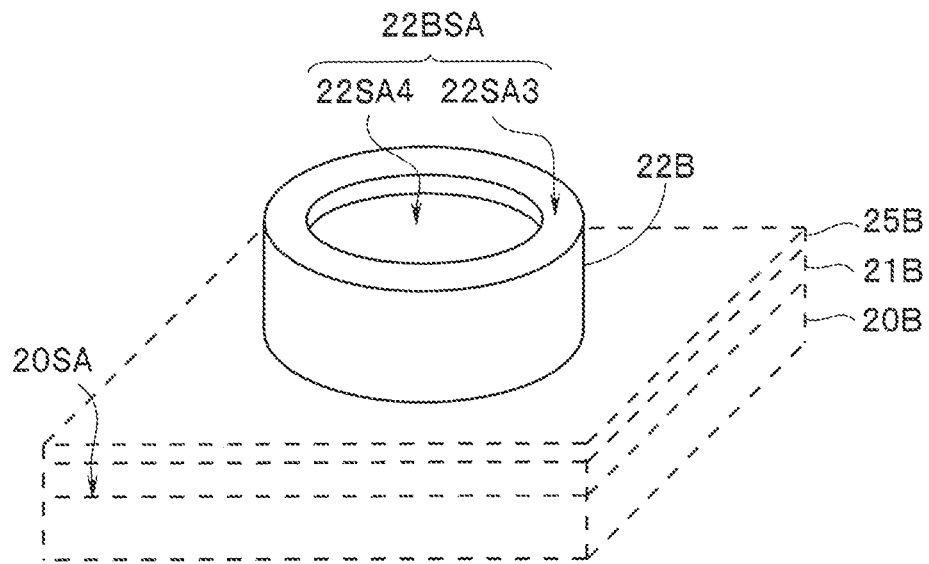
FIG. 8 is a perspective view of a second base body of the bonded body according to the second modification of the embodiment.

As illustrated in FIG. 8, a second surface 22BSA of the second electrode 22B having a substantially columnar shape is formed in a concave shape. In other words, the second surface 22BSA includes a ring-shaped third region 22SA3 and a fourth region 22SA4, the entire outer periphery of which is surrounded by the third region 22SA3 and the height of which from the second principal surface 20SA is lower than the height of the third region 22SA3 from the second principal surface 20SA.

The second electrode 22B covers the second wiring 21B exposed in the opening of the second passivation layer 25B and the periphery of the opening of the second passivation layer 25B. The circular region covering the second wiring 21B exposed in the opening of the second passivation layer 25B is the fourth region 22SA4, and the ring-shaped region covering the periphery of the opening is the third region 22SA3.

The height of the third region 22SA3 from the second principal surface 20SA is higher than the height of the fourth region 22SA4, which does not cover the second passivation layer 25, from the second principal surface 20SA. In other words, the height of the third region 22SA3 from the second principal surface 20SA is a sum of the thickness of the second passivation layer 25B and the thickness of the second electrode 22B.

As illustrated in FIG. 7, the second region 12SA2 of the first electrode 12 and the fourth region 22SA4 of the second electrode 22B are in contact with each other, and the solder 30 is disposed between the first region 12SA1 of the first electrode 12 and the second electrode 22B.

Figure 9:
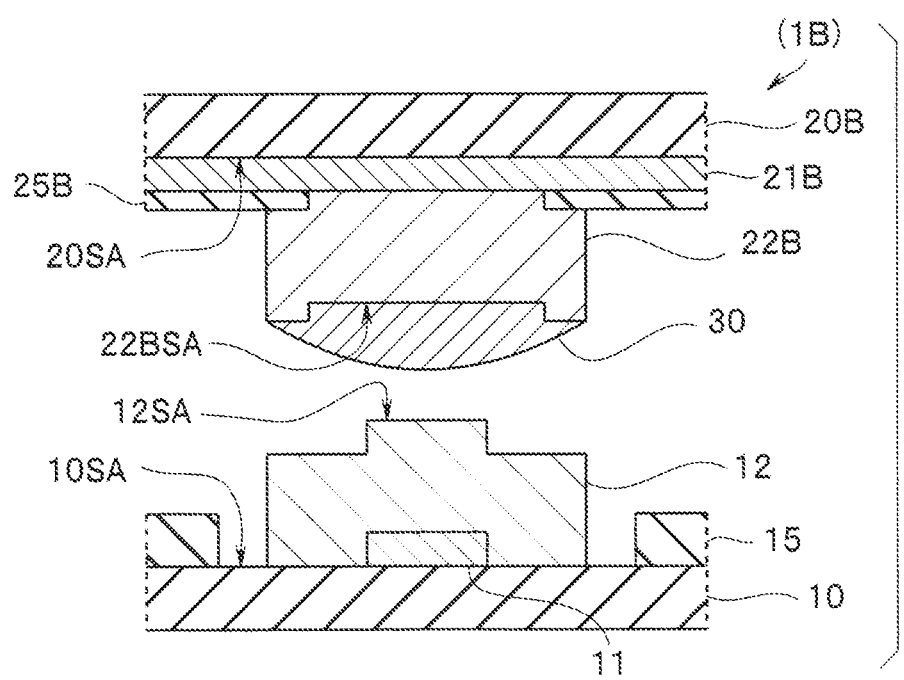
FIG. 9 is a sectional view for describing a manufacturing method of the bonded body according to the second modification of the embodiment.

As illustrated in FIG. 9, also in the manufacturing method of the bonded body 1B, the solder 30 is not disposed on the first electrode before the bonding process, and is disposed only on the second electrode 22B. In the bonding process, the first electrode 12 and the second electrode 22B are brought into contact with each other, with the solder 30 being melted, to thereby cause the solder 30 to flow in between the first region 12SA1 of the first electrode 12 and the second electrode 22B.

Third Modification of Embodiment

Figure 10:
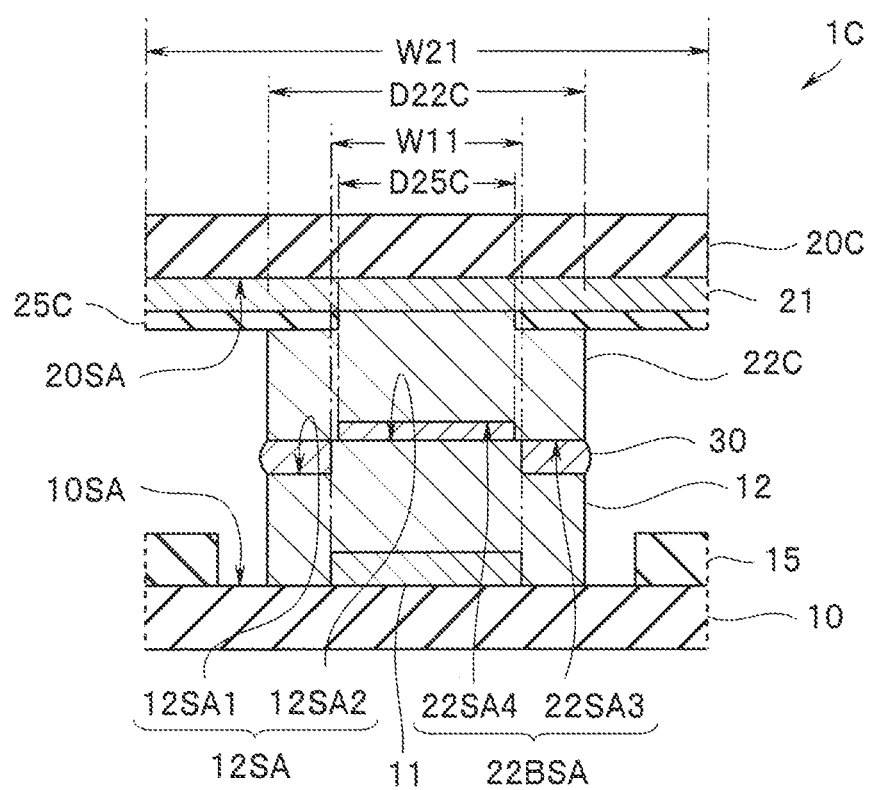
FIG. 10 is a sectional view of a bonded body according to a third modification of the embodiment.

As illustrated in FIG. 10, in a second base body 20C of the bonded body IC according to the third modification, a width W11 of a first wiring 11 is larger than a diameter D25C of an opening of a second passivation layer 25C. The second base body 20B of the bonded body 1C satisfies the condition of (Expression 5) shown below.

A width W21 of a second wiring 21>a diameter
D22C of a second electrode 22C>the width
W11 of the first wiring 11>the diameter D25C
of the opening of the second passivation layer
25C     (Expression 5)

A second region 12SA2 of a first electrode 12 is in contact with a third region 22SA3 of the second electrode 22B. The solder 30 is disposed between a first surface 12SA of the first electrode 12 and a second surface 22BSA of the second electrode 22B.

As described above, in the bonded bodies 1, 1A, 1B, and 1C, as long as the first surface 12SA of the first electrode 12 is a convex surface having the second region 12SA2, the height of which is higher than that of the first region 12SA1, the second surface 22SA of the second electrode 22 may be a flat surface, a convex surface, or a concave surface.

Fourth Modification of Embodiment

Figure 11:
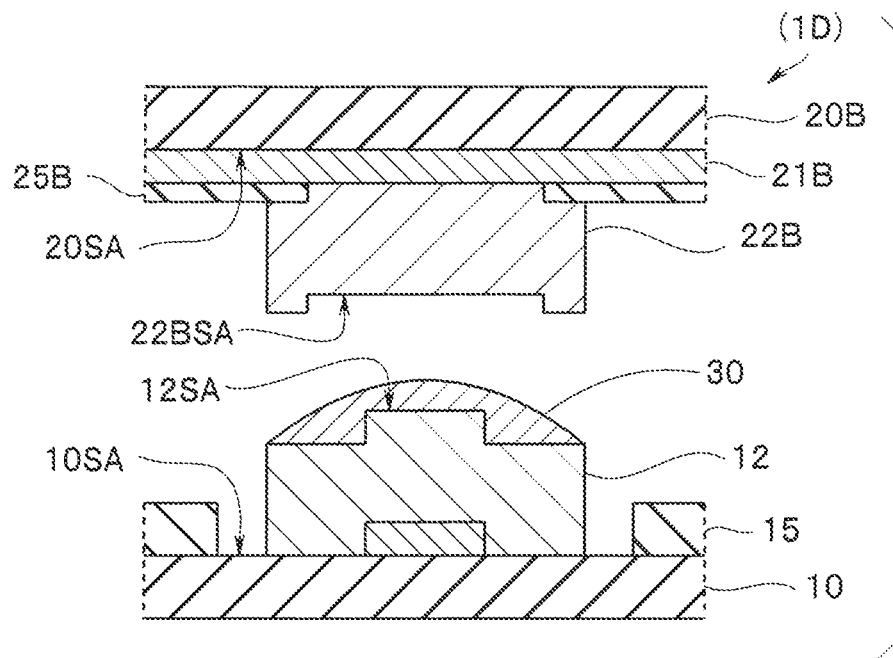
FIG. 11 is a sectional view for describing a manufacturing method of a bonded body according to a fourth modification of the embodiment.
Figure 12:
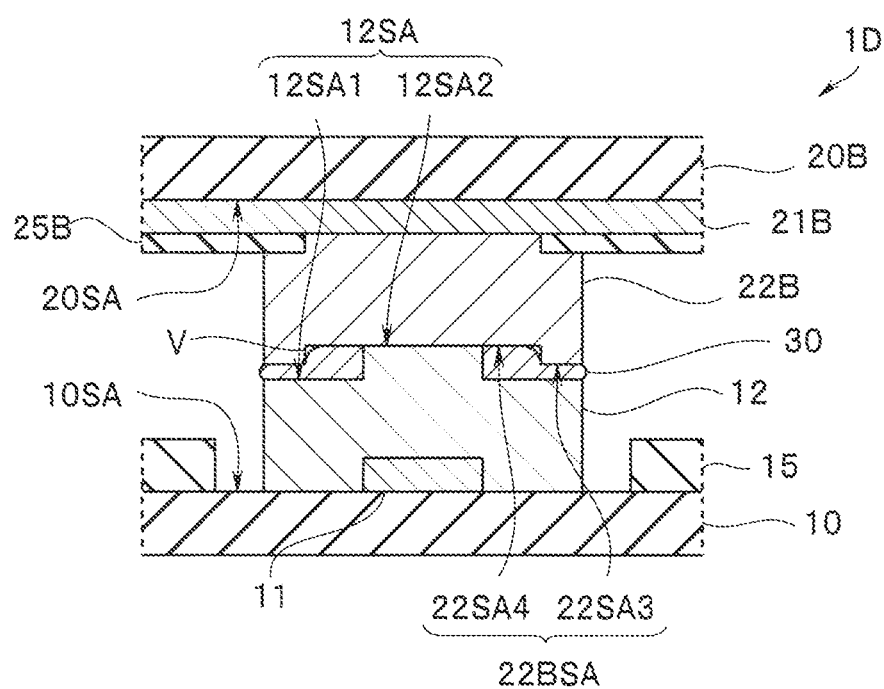
FIG. 12 is a sectional view for describing the manufacturing method of the bonded body according to the fourth modification of the embodiment.

The bonded body 1D illustrated in FIGS. 11 and 12 is similar to the bonded body 1B. However, before the bonding process, the solder 30 is disposed on a first electrode 12 having a first surface 12SA formed as a convex surface, and is not disposed on a second electrode 22B having a second surface 22BSA formed as a concave surface.

If the first electrode 12 and the second electrode 22B are brought into contact with each other, with the solder 30 being melted in the bonding process, air might remain on an outer periphery of a fourth region 22SA4 of the second electrode 22B, which possibly creates a void V in which no solder is present (FIG. 12).

The bonded bodies 1, 1A, 1B, and 1C are configured such that the solder 30 is disposed on the second electrode 22B before the bonding process, to thereby prevent a void from being created on the bonding surfaces and provide a higher reliability than the bonded body 1D.

In the description above, although description has been made by taking, as an example, a case where the first electrode 12 and the second electrode 22 are formed in the substantially columnar shapes, and the openings of the passivation layers 15 and 25 have the circular shapes, the shapes of the components can be changed. For example, the first electrode 12 may have a rectangular columnar shape, and the second electrode 22 may have a substantially columnar shape. The opening of the first passivation layer 15 may have a circular shape, and the opening of the second passivation layer 25 may have a rectangular shape.

The present invention is not limited to the above-described embodiment, modifications, or the like, but various changes, modifications, etc., are possible without changing the gist of the present invention.

What is claimed is:

1. A bonded body comprising:
   a first base body comprising a first principal surface on which a first wiring, a first electrode made of an electroplating film, and a first passivation layer made of an insulating material are disposed, the first electrode including a first surface having a first region covering a periphery of an end portion of the first wiring and a second region covering the end portion of the first wiring, the first passivation layer covering a periphery of the first electrode;
   a second base body comprising a second principal surface on which a second electrode is disposed; and
   solder disposed between the first region of the first electrode and the second electrode.

2. The bonded body according to claim 1, wherein
   the first electrode is provided in an opening of the passivation layer,
   the second region has a height higher than a height of the first region due to a thickness of the first wiring, and
   the first wiring is electrically connected to the first electrode in the opening.

3. The bonded body according to claim 1, wherein the second region of the first electrode is in contact with the second electrode.

4. The bonded body according to claim 1, wherein the second surface of the second electrode includes a third region, and a fourth region, an entire outer periphery of which is surrounded by the third region, the fourth region having a height lower than a height of the third region.

5. A manufacturing method of a bonded body in which a first base body comprising a first principal surface and a second base body comprising a second principal surface are bonded to each other,
   the first base body comprising a first wiring and a first electrode that are disposed on the first principal surface, the first electrode including a first surface having a first region covering a periphery of an end portion of the first wiring and a second region covering the end portion of the first wiring, the second region having a height higher than a height of the first region due to a thickness of the first wiring, the second base body comprising a second electrode disposed on the second principal surface, the method comprising:

bringing the first electrode and the second electrode into contact with each other, with solder disposed on the second electrode being melted; and causing the solder to flow in between the first region of the first electrode and a second surface of the second electrode.

6. The manufacturing method of the bonded body according to claim 5, further comprising:

bringing the second region and the second electrode into contact with each other, and accommodating the melted solder between the second region of the first electrode and the second electrode.

7. The manufacturing method of the bonded body according to claim 6, wherein the second surface of the second electrode includes a third region and a fourth region, an entire outer periphery of which is surrounded by the third region, the fourth region having a height lower than a height of a third region, and the solder is not disposed on the first electrode, before bringing the second region and the second electrode into contact with each other.

* * * * *